(12) United States Patent
Jiang et al.

(10) Patent No.: US 12,073,650 B2
(45) Date of Patent: Aug. 27, 2024

(54) DISPLAY PANEL AND ELECTRONIC DEVICE

(71) Applicant: WUHAN CHINA STAR OPTOELECTRONICS SEMICONDUCTOR DISPLAY TECHNOLOGY CO., LTD., Hubei (CN)

(72) Inventors: Xiaosu Jiang, Hubei (CN); Chongpeng Ruan, Hubei (CN); Manman Ding, Hubei (CN); Shengze Liu, Hubei (CN); Wenxu Xianyu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/622,840

(22) PCT Filed: Dec. 20, 2021

(86) PCT No.: PCT/CN2021/139768
§ 371 (c)(1),
(2) Date: Jun. 22, 2023

(87) PCT Pub. No.: WO2023/108688
PCT Pub. Date: Jun. 22, 2023

(65) Prior Publication Data
US 2024/0037980 A1    Feb. 1, 2024

(30) Foreign Application Priority Data
Dec. 14, 2021   (CN) .......................... 202111528780.3

(51) Int. Cl.
*G06V 40/13* (2022.01)
*H10K 39/34* (2023.01)
(Continued)

(52) U.S. Cl.
CPC ......... *G06V 40/1318* (2022.01); *H10K 39/34* (2023.02); *H10K 59/131* (2023.02); *H10K 59/873* (2023.02); *H10K 59/879* (2023.02)

(58) Field of Classification Search
CPC .. G06V 40/1318; H10K 39/34; H10K 59/131; H10K 59/873; H10K 59/879
See application file for complete search history.

(56) References Cited

U.S. PATENT DOCUMENTS 11,080,505 B2 *   8/2021  Haddad .............. G06V 40/1324
11,170,195 B2 *  11/2021  Du ..................... G06V 40/1329
(Continued)

FOREIGN PATENT DOCUMENTS

| CN | 106940488 A | 7/2017 |
|----|-------------|--------|
| CN | 108899356 A | 11/2018 |

(Continued)

OTHER PUBLICATIONS

International Search Report in International application No. PCT/CN2021/139768, mailed on Jul. 29, 2022.
(Continued)

*Primary Examiner* — Vinh T Lam
(74) *Attorney, Agent, or Firm* — PV IP PC; Wei Te Chung; Zhigang Ma (57) ABSTRACT

A display panel and an electronic device are provided. The display panel includes a first panel, a second panel, and a binding layer. The first panel includes light-emitting units, and also includes light-transmitting regions. The second panel includes photoelectric sensing elements and a second driving circuit layer. The second driving circuit layer (Continued)

includes second driving transistors. The second driving transistors are electrically connected to the photoelectric sensing elements, and the photoelectric sensing elements are opposite to the light-transmitting regions. The binding layer is disposed between the first panel and the second panel, and configure to bind the first panel and the second panel.

20 Claims, 5 Drawing Sheets (51) Int. Cl.
*H10K 59/131* (2023.01)
*H10K 59/80* (2023.01)

(56) References Cited

U.S. PATENT DOCUMENTS

| | | | | |
|---|---|---|---|---|
| 11,378,253 B2 * | 7/2022 | Park | ............... | G02B 3/0006 |
| 11,521,995 B2 * | 12/2022 | Kim | ............... | H01L 27/14605 |
| 11,733,792 B2 * | 8/2023 | Lin | ............... | G06V 40/1306 |
| | | | | 345/173 |
| 11,741,739 B2 * | 8/2023 | Sung | ............... | H01L 31/12 |
| | | | | 382/124 |
| 11,741,745 B2 * | 8/2023 | Setterberg | ............... | G06V 10/143 |
| | | | | 382/124 |
| 11,797,115 B2 * | 10/2023 | Kim | ............... | G06F 3/0446 |
| 11,854,294 B2 * | 12/2023 | Park | ............... | G06V 40/1318 |
| 11,869,268 B2 * | 1/2024 | Hu | ............... | G06F 3/0412 |
| 2021/0043692 A1 * | 2/2021 | Cha | ............... | H10K 59/126 |
| 2023/0109051 A1 * | 4/2023 | Jeon | ............... | G06V 40/1318 |
| | | | | 257/72 |
| 2023/0142687 A1 * | 5/2023 | Ren | ............... | H10K 59/122 |
| | | | | 257/40 |

FOREIGN PATENT DOCUMENTS

| | | | |
|---|---|---|---|
| CN | 109034089 | A | 12/2018 |
| CN | 110046567 | A | 7/2019 |
| CN | 111106157 | A | 5/2020 |
| CN | 111414795 | A | 7/2020 |
| CN | 111725429 | A | 9/2020 |
| CN | 111768700 | A | 10/2020 |
| CN | 112364760 | A | 2/2021 |
| CN | 113066840 | A | 7/2021 |
| CN | 113130602 | A | 7/2021 |
| WO | 2020243926 | A1 | 12/2020 |
| WO | 2021042501 | A1 | 3/2021 |
| WO | 2021159379 | A1 | 8/2021 |

OTHER PUBLICATIONS

Written Opinion of the International Search Authority in International application No. PCT/CN2021/139768, mailed on Jul. 29, 2022.

Chinese Office Action issued in corresponding Chinese Patent Application No. 202111528780.3 dated Feb. 10, 2023, pp. 1-12.

* cited by examiner

DISPLAY PANEL AND ELECTRONIC DEVICE

FIELD OF DISCLOSURE

The present disclosure relates to the field of flexible display technologies, in particular to a display panel and an electronic device.

BACKGROUND

In recent years, with the rapid development of touch technologies, mobile products have been integrated with push-type and slide-type fingerprint identification technologies based on silicon-based processes. In the future, a core of people's attention is the fingerprint identification technology in a display area.

A principle of the fingerprint recognition is as follows. A panel emits light. Photoelectric sensors receive light reflected from valleys or ridges of the fingerprint and generate corresponding electrical signals. Since reflections of the valleys and ridges are different, the generated electrical signals are also different, so that the valleys and the ridges can be identified.

At present, the fingerprint identification technology mainly uses the photoelectric sensors to acquire fingerprint images. However, the existing fingerprint recognition technology has a problem of large signal-to-noise ratio.

SUMMARY OF DISCLOSURE

The existing fingerprint recognition technology has the problem of large signal-to-noise ratio.

In view of this, the present disclosure provides a display panel and an electronic device that can reduce or eliminate an incident stray light from an ambient environment and make reflected light incident on a photosensitive layer at an angle as small as possible to improve the signal-to-noise ratio.

The present disclosure provides a display panel, including:
- a first panel including a plurality of light-emitting units, wherein the first panel further includes a plurality of light-transmitting regions, one of the light-transmitting regions is disposed between two adjacent light-emitting units;
- a second panel including a plurality of photoelectric sensing elements and a second driving circuit layer, wherein the second driving circuit layer includes a plurality of second driving transistors, the second driving transistors are electrically connected to the photoelectric sensing elements, and the photoelectric sensing elements are opposite to the light-transmitting regions; and
- a binding layer disposed between the first panel and the second panel, and configure to bind the first panel and the second panel.

In an alternative embodiment of the present disclosure, the binding layer is light-transmissive.

In an alternative embodiment of the present disclosure, the binding layer is an optical adhesive.

In an alternative embodiment of the present disclosure, a thickness of the binding layer ranges from 52 µm to 100 µm.

In an alternative embodiment of the present disclosure, the first panel further includes a first driving circuit layer and a pixel definition layer disposed on the first driving circuit layer, the pixel definition layer includes a light-transmitting portion and an opaque portion, the opaque portion of the pixel definition layer includes a plurality of pixel openings, one of the light-emitting units is arranged in one of the pixel openings, the light-transmitting portion of the pixel definition layer is disposed in the light-transmitting regions, the light-transmitting portion of the pixel definition layer includes a plurality of light-transmitting holes, and each of the light-transmitting holes is disposed between two adjacent pixel openings.

In an alternative embodiment of the present disclosure, the pixel definition layer is black.

In an alternative embodiment of the present disclosure, an orthographic projection of each of the light-transmitting holes on the second driving circuit layer at least partially overlaps an orthographic projection of a corresponding photoelectric sensing element on the second driving circuit layer.

In an alternative embodiment of the present disclosure, a diameter of the light-transmitting hole is d, a distance from an end of the light-transmitting hole of the first panel far from the second panel to the photoelectric sensing element is H, an incident angle of the display panel is θ, θ=arctan (d/2H), a value of H ranges from 90 µm to 150 µm, and a value of d ranges from 25 km to 60 km.

In an alternative embodiment of the present disclosure, the first panel further includes a first substrate, the first driving circuit layer is formed on the first substrate, the light-emitting units are formed on a side of the first driving circuit layer away from the first substrate, and the binding layer is disposed on a side of the first substrate away from the first driving circuit layer.

In an alternative embodiment of the present disclosure, the first panel further includes a first encapsulation layer and a plurality of lenses, the first encapsulation layer is formed on the pixel definition layer and covers the light-emitting units, the plurality of lenses are formed on the first encapsulation layer and arranged in an array, and one of the lenses is opposite to one of the light-transmitting regions.

In an alternative embodiment of the present disclosure, the second panel further includes a second encapsulation layer, the second encapsulation layer is formed on the second driving circuit layer and covers the photoelectric sensing elements, and the binding layer is disposed on a side of the second encapsulation layer away from the second driving circuit layer.

In an alternative embodiment of the present disclosure, the first driving circuit layer includes a plurality of first driving transistors correspondingly electrically connected to the light-emitting units, the second driving circuit layer further includes a plurality of third driving transistors, and the third driving transistors are electrically connected to the first driving transistors.

In an alternative embodiment of the present disclosure, the display panel further includes a plurality of via holes formed on the binding layer, each of the via holes is filled with a conductive material, one of the first driving transistors and one corresponding third driving transistor are electrically connected through one of the via holes.

In an alternative embodiment of the present disclosure, the photoelectric sensing elements are photoelectric detecting elements.

The present disclosure also provides an electronic device, including a device main body. The electronic device also includes the display panel as described above. The display panel is disposed on the device main body or in the device main body.

In the display panel and the electronic device of the present disclosure, the first panel including the light-emitting units is bound to the second panel including the photoelectric sensing elements by the binding layer. The binding layer is disposed between the first panel and the second panel. The photoelectric sensing elements are opposite to the light-transmitting holes on the pixel definition layer of the first panel. The binding layer can increase and regulate the distance between the light-transmitting hole and the photoelectric sensing element, thereby forming an approximately collimated optical path between the light-transmitting hole and the photoelectric sensing element. According to the light incident angle $\theta=\arctan(d/2H)$, the light incident angle is inversely proportional to H, where d is the diameter of the light-transmitting hole, and H is the distance from the light-transmitting hole to the photoelectric sensing element. When H increases, the light incident angle becomes smaller. Therefore, the display panel and the electronic device of the present disclosure can reduce or eliminate an incident stray light from an ambient environment and make the reflected light incident on the photosensitive layer at an angle as small as possible, thereby improving a signal-to-noise ratio.

BRIEF DESCRIPTION OF DRAWINGS

In order to more clearly describe technical solutions in embodiments of the present disclosure, the following will briefly introduce drawings needed in the description of the embodiments. Apparently, the drawings in the following description are only some embodiments of the present disclosure. For example, for those skilled in the art, without creative efforts, other drawings can be obtained from these drawings.

DETAILED DESCRIPTION

The technical solutions in the embodiments of the present disclosure will be clearly and completely described below in conjunction with the drawings in the embodiments of the present disclosure. Apparently, the described embodiments are only a part of the embodiments of the present disclosure, rather than all the embodiments. Based on the embodiments in the present disclosure, all other embodiments obtained by those skilled in the art without creative efforts shall fall within the scope of protection of the present disclosure.

In the description of the present disclosure, it should be understood that directions or location relationships indicated by terms such as "upper", "lower", and so on, are directions or location relationships shown based on the accompanying drawings, are merely used for the convenience of describing the present disclosure and simplifying the description, but are not used to indicate or imply that a device or an element must have a particular direction or must be constructed and operated in a particular direction, and therefore, cannot be understood as a limitation to the present disclosure. In addition, terms "first" and "second" are used merely for the purpose of description, and shall not be construed as indicating or implying relative importance or implying a quantity of indicated technical features. Therefore, a feature limited by "first" or "second" may explicitly or implicitly include one or more of the features. In the descriptions of the present disclosure, unless otherwise explicitly specified, "plurality of" means two or more than two.

In the present disclosure, reference numerals and/or reference letters may be repeated in different examples. The repetition is for the purpose of simplicity and clarity and does not mean the relationship between the various embodiments and/or arrangements discussed.

The present disclosure addresses a technical problem of large signal-to-noise ratio in an existing fingerprint recognition technology. By binding a first panel including light-emitting units and a second panel including photoelectric sensing elements through a binding layer. The photoelectric sensing elements are opposite to light-transmitting holes on a pixel definition layer of the first panel. The binding layer is disposed between the second panel and the first panel to reduce or eliminate the incident stray light in an ambient environment and make the reflected light incident on the photosensitive layer at an angle as small as possible to improve the signal-to-noise ratio.

Figure 1:
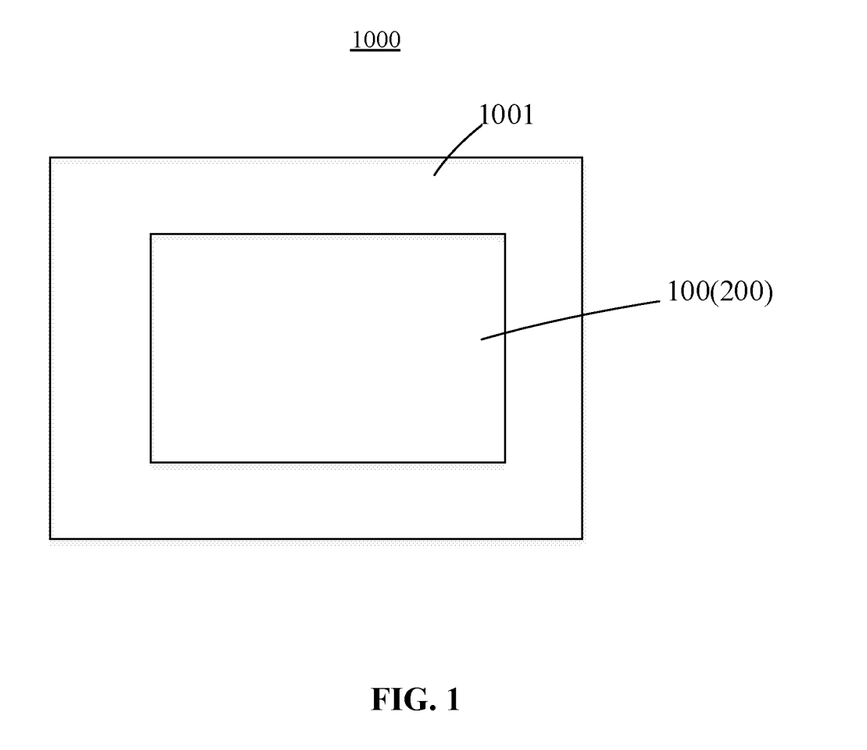
FIG. 1 is a schematic diagram of modules of an electronic device of the present disclosure.

Referring to FIG. 1, a preferred embodiment of the present disclosure provides an electronic device 1000. The electronic device 1000 includes a display panel 100 (200) and a device main body 1001. The display panel 100 (200) is disposed on the device main body 1001 or in the device main body 1001. In this embodiment, the electronic device may be a mobile phone or a computer.

Figure 2:
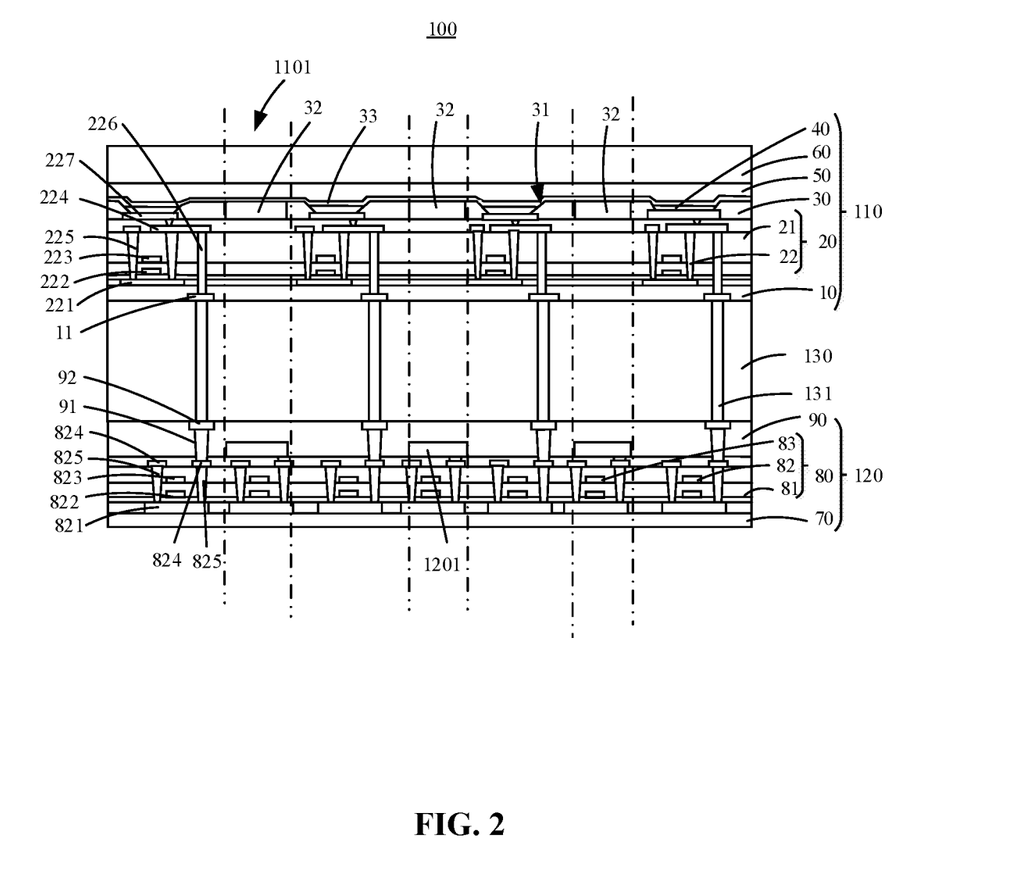
FIG. 2 is a schematic diagram of film layers of a display panel of a first embodiment of the present disclosure.
Figure 3:
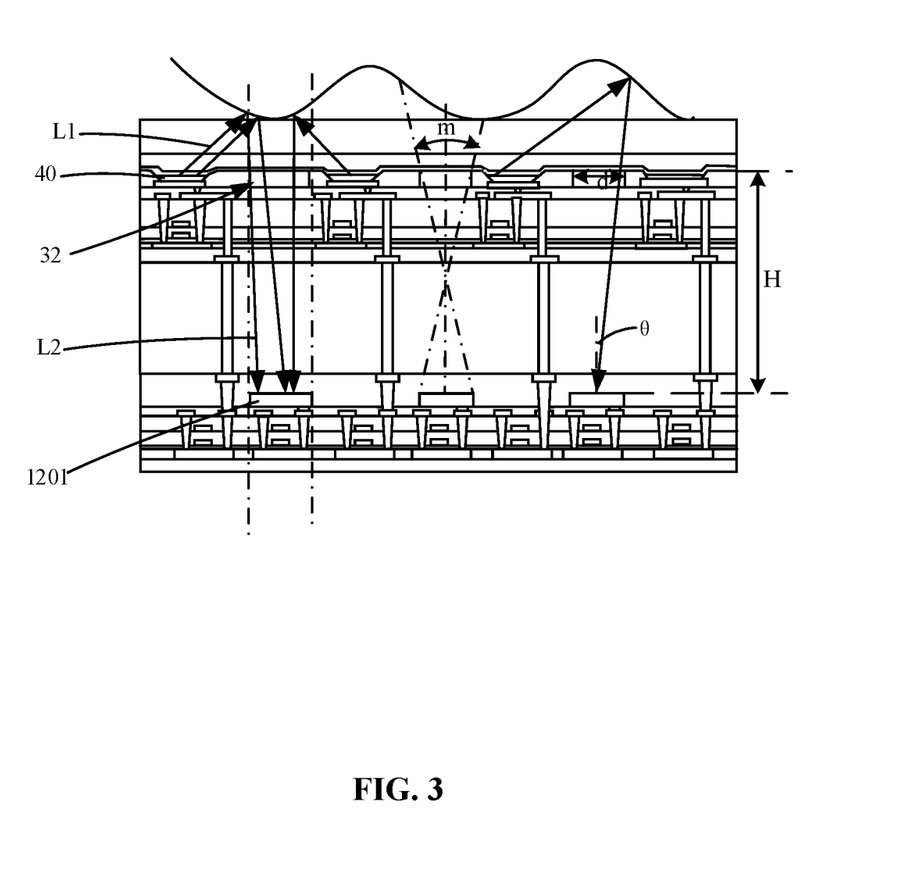
FIG. 3 is a schematic diagram of an optical path of the display panel shown in FIG. 2.

Referring to FIG. 2 and FIG. 3, a first embodiment of the present disclosure provides a display panel 100. The display panel 100 includes a first panel 110, a second panel 120, and a binding layer 130. The first panel 110 and the second panel 120 are bound together by the binding layer 130. The binding layer 130 is disposed between the first panel 110 and the second panel 120. The first panel 110 includes a plurality of light-transmitting regions 1101.

The first panel 110 includes a first substrate 10, a first driving circuit layer 20, a pixel definition layer 30, a light-emitting unit 40, and a first encapsulation layer 50. The first driving circuit layer 20 is formed on the first substrate 10. The pixel definition layer 30 is formed on the first driving circuit layer 20. The light-emitting units 40 are arranged in the pixel definition layer 30. The first encapsulation layer 50 is formed on the pixel definition layer 30 and covers the light-emitting units 40. One of the light-transmitting regions 1101 is disposed between two adjacent light-emitting units 40.

The first substrate 10 includes a plurality of first connection terminals 11. The plurality of first connection terminals are embedded in the first substrate 10 and are exposed at a surface of the substrate 10 away from the first driving circuit layer 20.

The first driving circuit layer 20 includes a first composite insulating film layer 21 and a plurality of first driving transistors 22 embedded in the first composite insulating film layer 21. The first driving transistors 22 drive the light-emitting units 40 to emit light.

The first composite insulating film layer 21 is formed on a surface of the first substrate 10 away from the first connection terminals 11. The first composite insulating film layer 21 includes a plurality of insulating film layers (not numbered in the drawings) such as a gate insulating layer, an interlayer insulating layer, and a planarization layer. One end of the first driving transistor 22 is electrically connected to the first connection terminal 11. Specifically, in this embodiment, each of the first driving transistors 22 includes a first active layer 221, a first gate 222, a second gate 223, and a first source-drain layer 224. The first active layer 221 is formed on the surface of the first substrate 10 away from the first connection terminals 11. The first gate 222 is formed above the first active layer 221. The second gate 223 is formed above the first gate 222. The first source-drain layer 224 is formed above the second gate 223. A part of the first composite insulating film layer 21 (e.g., the gate insulating layer) is provided between the first active layer 221 and the first gate 222. A part of the first composite insulating film layer 21 (e.g., the first interlayer insulating layer) is provided between the first gate 222 and the second gate 223. A part of the first composite insulating film layer 21 (e.g., the second interlayer insulating layer) is provided between the second gate 223 and the first source-drain layer 224. A part of the first composite insulating film layer 21 (e.g., the planarization layer) is also disposed above the first source-drain layer 224. In other embodiments, each of the first driving transistors 22 may not include the second gate 223.

A portion of the first composite insulating film layer 21 corresponding to the light-transmitting regions 1101 is light-transmissive.

A source and a drain of the first source-drain layer 224 are correspondingly electrically connected to the first active layer 221 through first vias 225. The source or the drain of the first source-drain layer 224 is also electrically connected to a corresponding first connection terminal 11 through a second via 226. Both the first via 225 and the second via 226 are filled with conductive material.

The part of the first composite insulating film layer 21 (e.g., the planarization layer) above the first source-drain layer 224 further includes a plurality of anodes 227. One end of the anode 227 is electrically connected to the first source-drain layer 224, and the other end is electrically connected to the light-emitting unit 40.

The pixel definition layer 30 includes an opaque portion and a light-transmitting portion, the opaque portion of the pixel definition layer 30 includes a plurality of pixel openings 31, and one of the light-emitting units 40 is arranged in one of the pixel openings 31. The light-transmitting portion of the pixel definition layer 30 is disposed in the light-transmitting regions 1101. The light-transmitting portion of the pixel definition layer 30 includes a plurality of light-transmitting holes 32. Each of the light-transmitting holes 32 is disposed between two adjacent pixel openings 31. A diameter of the light-transmitting hole 32 is less than or equal to a diameter of the light-transmitting region 1101. The light-transmitting holes 32 may be filled with light-transmitting materials or not filled with other materials. The pixel definition layer 30 is opaque so that the light reflected by the fingerprint can only enter photoelectric sensing elements 1201 (see below) from the light-transmitting holes 32. Thus, the amount and angle of light entering the photoelectric sensing elements 1201 can be restricted.

In an alternative embodiment of the present disclosure, the pixel definition layer 30 is black.

In an alternative embodiment of the present disclosure, an orthographic projection of each of the light-transmitting holes 32 on the second driving circuit layer 80 of the second display panel 120 at least partially overlaps an orthographic projection of a corresponding photoelectric sensing element 1201 on the second driving circuit layer 80 of the second display panel 120. Preferably, the orthographic projections of each of the light-transmitting holes 32 and the corresponding photoelectric sensing element 1201 (see below) on the second panel 120 completely overlap.

The first panel 110 further includes a cathode layer 33 formed on the light-emitting units 40 and formed on the pixel definition layer 30.

The first encapsulation layer 50 is formed on the pixel definition layer 30 and covers the cathode layer 33.

The first panel 110 further includes an outer film layer 60, and the outer film layer 60 is formed on the first encapsulation layer 50.

The outer film layer 60 may be a touch layer, a protective layer, a planarization layer, or other film layer. In this embodiment, the outer film layer 60 is the touch layer.

The outer film layer 60 may be a single film layer or multiple film layers.

The second panel 120 includes a second substrate 70, a second driving circuit layer 80, a second encapsulation layer 90, and a plurality of photoelectric sensing elements 1201. The second driving circuit layer 80 is formed on the second substrate 70, the plurality of photoelectric sensing elements 1201 are formed on the second driving circuit layer 80. The second encapsulation layer 90 is formed on the second driving circuit layer 80 and covers the plurality of photoelectric sensing elements 1201. The binding layer 130 is formed on the second encapsulation layer 90. The plurality of photoelectric sensing elements 1201 are correspondingly opposite to the plurality of light-transmitting regions 1101 or the light-transmitting holes 32. The orthographic projections of each of the light-transmitting holes 32 and the corresponding photoelectric sensing element 1201 on the second driving circuit layer 80 of the second display panel 120 at least partially overlap.

In this embodiment, the photoelectric sensing elements 1201 are organic photoelectric detecting (OPD) elements. In other embodiments, the photoelectric sensing element 1201 may also be detecting devices or photoelectric sensing devices other than the OPD, such as Si-PD and other types of detectors.

Referring to FIG. 2, in an alternative embodiment of the present disclosure, the second driving circuit layer 80 includes a second composite insulating film layer 81 and a plurality of third driving transistors 82 and a plurality of second driving transistors 83 embedded in the second composite insulating film layer 81.

The third driving transistors 82 are electrically connected to the first driving transistors 22. The third driving transistors 82 are configured to transmit driving signals to the first driving transistors 22 to drive the light-emitting units 40 of the first panel to emit light. The second driving transistors 83 and the first driving transistors 22 are respectively disposed in two different panels and are bound together by splicing daughter and mother boards. The second driving transistors 83 do not occupy a bezel area, and can effectively reduce an area of peripheral circuits, thereby achieving a narrow bezel.

Specifically, the second composite insulating film layer 81 includes multiple insulating film layers (not shown in the drawings) such as a gate insulating layer, an interlayer insulating layer, and a planarization layer.

The second driving transistors 83 are electrically connected to the photoelectric sensing elements 1201. The third driving transistors 82 and the second driving transistors 83 are independent of each other and do not have an electrical connection relationship. The third driving transistors 82 are configured to transmit driving signals to the first driving transistors 22 to drive the light-emitting units 40 to emit light. The second driving transistors 83 are configured to drive the photoelectric sensing elements 1201 to work.

Specifically, in this embodiment, each of the third driving transistors 82 includes a second active layer 821, a third gate 822, a fourth gate 823, and a second source-drain layer 824. The second active layer 821 is formed on the second substrate 70. The third gate 822 is formed above the second active layer 821. The fourth gate 823 is formed above the third gate 822. The second source-drain layer 824 is formed above the fourth gate 823. The second source-drain layer 824 is electrically connected to the second active layer 821 through third vias 825. A part of the second composite insulating film layer 81 (e.g., the gate insulating layer) is provided between the second active layer 821 and the third gate 822. A part of the second composite insulating film layer 81 (e.g., the third interlayer insulating layer) is provided between the third gate 822 and the fourth gate 823. A part of the second composite insulating film layer 81 (e.g., the fourth interlayer insulating layer) is provided between the fourth gate 823 and the second source-drain layer 824. A part of the second composite insulating film layer 81 (e.g., the planarization layer) is also disposed above the second source-drain layer 824. In other embodiments, each of the third driving transistors 82 may not include the fourth gate 823.

A portion of the second encapsulation layer 90 corresponding to the light-transmitting regions 1101 is light-transmissive.

The second encapsulation layer 90 includes a plurality of fourth vias 91 and a plurality of third connection terminals 92. The plurality of fourth vias 91 and the plurality of third connection terminals 92 are embedded in the second encapsulation layer 90. One end of the third connection terminal 92 is exposed at a surface of the second encapsulation layer 90 away from the second driving circuit layer 80. The plurality of third connection terminals 92 are correspondingly electrically connected to the source-drain layer 824 of the third driving transistors 82 corresponding through the fourth vias 91.

A structure of the second driving transistor 83 is the same as a structure of the third driving transistor 82. A difference is that the second driving transistor 83 is electrically connected to the photoelectric sensing element 1201.

The binding layer 130 and the first composite film layer 21 and the second composite film layer 81 in the light-transmitting regions 1101 are light-transmissive.

In an alternative embodiment of the present disclosure, the binding layer 130 is an optical adhesive. The optical adhesive has good light transmittance and can filter stray light well.

In an alternative embodiment of the present disclosure, a thickness of the binding layer 130 ranges from 52 µm to 100 µm, so as to better reduce or eliminate the incident stray light in an ambient environment and make the reflected light incident on the photosensitive layer at an angle as small as possible to improve the signal-to-noise ratio.

The binding layer 130 includes a plurality of via holes 131, and the plurality of via holes 131 are filled with conductive material. Two ends of one of the via holes 131 are respectively electrically connected to the first connection terminal 11 and the third connection terminal 92 to connect the first driving transistor 22 with the corresponding third driving transistor 82.

Referring to FIG. 3, when the touch layer is touched, a fingerprint is formed on the touch layer. Light L1 emitted by the light-emitting units 40 is reflected by the fingerprint. A part of reflected light L2 can sequentially enter the first composite film layer 21 corresponding to the light-transmitting regions 1101, the binding layer 130, and the second encapsulation layer 90 corresponding to the light-transmitting regions 1101 through the light-transmitting holes 32, and then irradiates the photoelectric sensing elements 1201. By setting the diameter of the light-transmitting hole 32 and the thickness of the binding layer 130, the incident angle θ of the light reflected by the fingerprint and a range m of the reflected light of the fingerprint can be controlled.

The light incident angle θ=arctan(d/2H), d is the diameter of the light-transmitting hole 32, and H is the distance from an end of the light-transmitting hole 32 away from the second panel 120 to the photoelectric sensing element 1201. A value of H ranges from 90 µm to 150 µm. A value of d ranges from 25 µm to 60 µm. Correspondingly, a value of the incident angle θ ranges from 4.764° to 18.434°. The binding layer 130 causes an increase of the distance from the light-transmitting hole 32 to the photoelectric sensing element 1201, that is, the value of H is increased. From the formula of the light incident angle, it is known that the light incident angle θ and H are inversely proportional. When H increases, the light incident angle becomes smaller. Therefore, the display panel 100 of the present disclosure can reduce or eliminate the incident stray light in an ambient environment and make the reflected light incident on the photosensitive layer at an angle as small as possible to improve the signal-to-noise ratio.

Figure 4:
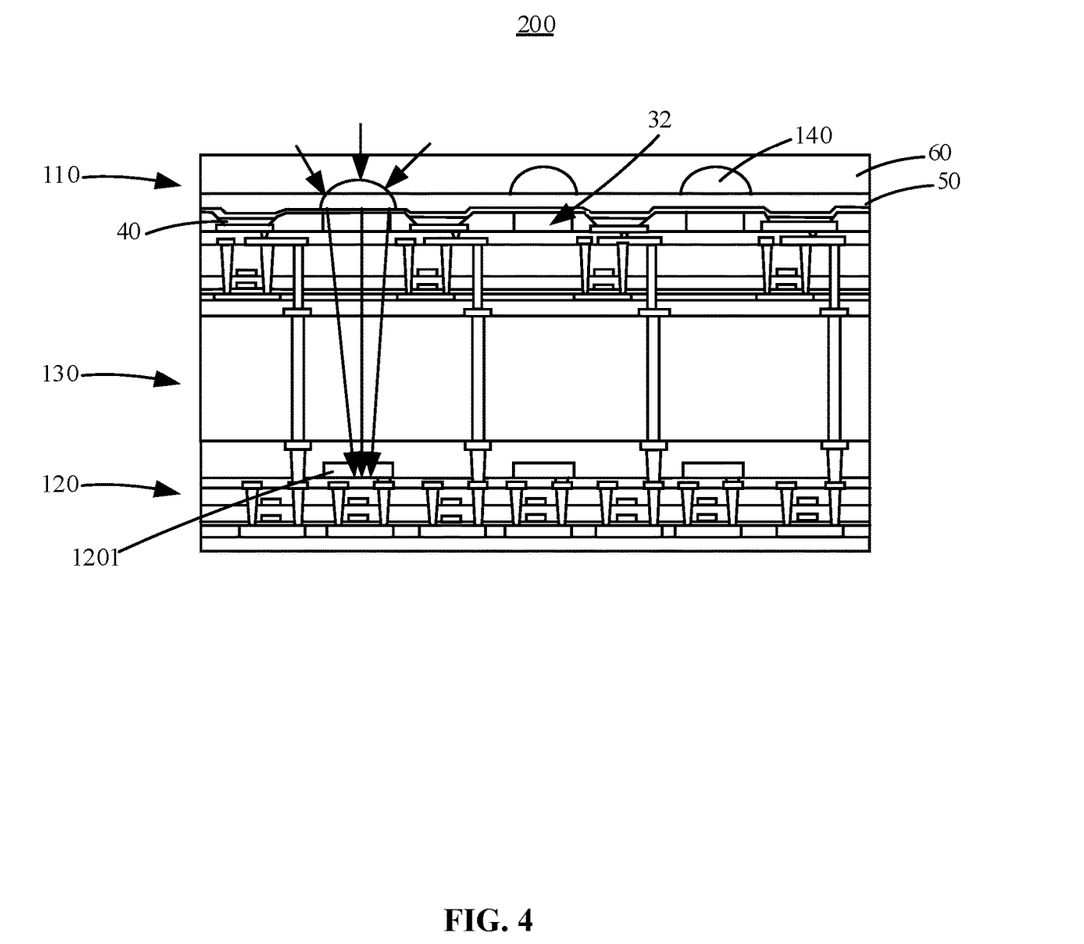
FIG. 4 is a schematic diagram of film layers of a display panel of a second embodiment of the present disclosure.

Referring to FIG. 4, the present disclosure also provides another display panel 200. A structure of the display panel 200 and that of the display panel 100 are basically the same. A difference is that the display panel 200 further includes a plurality of lenses 140. The plurality of lenses 140 are arranged in an array, are formed on the first encapsulation layer 50, and are covered by the outer film layer 60. One of the lenses 140 is opposite to one of the light-transmitting holes 32.

In this embodiment, the plurality of lenses 140 are micro lenses.

The lens 140 opposite to one of the light-transmitting holes 32 can condense the light reflected from the fingerprint and located above the photoelectric sensing element 1201 to the photoelectric sensing element 1201, thereby increasing the amount of light entering. Since the light entering the photoelectric sensing elements 1201 is sufficient, an aperture of the first panel 110 can be reduced (that is, a number of light-transmitting holes can be reduced), and the performance of the display panel 200 can be improved.

Figure 5:
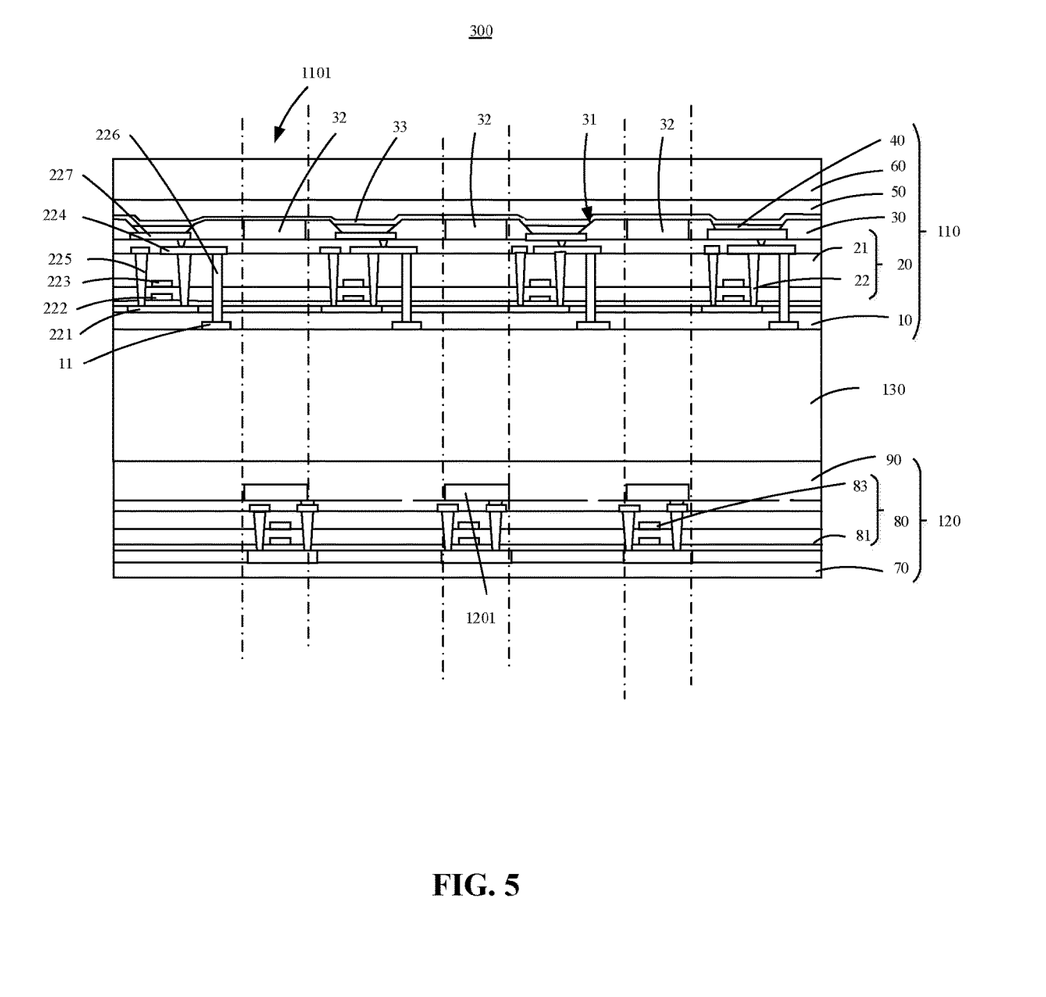
FIG. 5 is a schematic diagram of film layers of a display panel of a third embodiment of the present disclosure.

Referring to FIG. 5, the present disclosure also provides another display panel 300. A structure of the display panel 300 and that of the display panel 100 are basically the same. A difference is that the display panel 300 does not include the third driving transistors in the display panel 100. A driving circuit for driving the light-emitting units of the first panel 110 to emit light is electrically connected to the first driving transistors and is disposed in a bezel area (not shown) of the first panel 110 of the display panel 300.

The present disclosure provides the display panel and the electronic device. The first panel including the light-emitting units is bound to the second panel including the photoelectric sensing elements by the binding layer. The photoelectric sensing elements are opposite to the light-transmitting holes on the pixel definition layer of the first panel. The binding layer causes an increase of the distance from the light-transmitting hole to the photoelectric sensing element, that is, the value of H is increased, thereby forming an approximately collimated optical path between the light-transmitting hole and the photoelectric sensing element. According to the light incident angle θ=arctan(d/2H), the light incident angle is inversely proportional to H, where d is the diameter of the light-transmitting hole, and H is the distance from the light-transmitting hole to the photoelectric sensing element.

When H increases, the light incident angle becomes smaller. Therefore, the display panel and the electronic device of the present disclosure can reduce or eliminate an incident stray light from an ambient environment and make the reflected light incident on the photosensitive layer at an angle as small as possible, thereby improving a signal-to-noise ratio. In addition, the third driving transistors are disposed in the second panel to transmit the driving signals to the first driving transistors, thereby driving the light-emitting units of the first panel to emit light without occupying an area of the bezel region. The area of peripheral circuits can be effectively reduced, so that a narrow bezel can be realized.

In addition, the thickness of the binding layer can also be adjusted to control the value of the incident angle, so that the signal-to-noise ratio of the display panel can be more flexibly improved according to actual needs.

In addition, a plurality of micro-lenses are coupled to a side of the first panel away from the second panel, which can condense the light reflected from the fingerprint and located above the photoelectric sensing elements to the photoelectric sensing elements, thereby increasing the amount of light entering. The photoelectric sensing elements have sufficient light, so that the aperture of the first panel can be reduced (that is, the number of light-transmitting holes can be reduced), and the performance of the display panel can be improved.

In addition, the first panel including the light-emitting units and the second panel including the photoelectric sensing elements are bound together through the binding layer, which can also reduce process difficulty and improve yield. In particular, for the production of the photoelectric sensing elements, the process is not limited to a solution method or a small molecule evaporation method. Moreover, in comparison with forming the photoelectric sensing elements and the first display panel (e.g., the OLED device) through one process, the photoelectric sensing elements and the first display panel (e.g., the OLED device) are separately formed and then spliced, the process difficulty can be reduced, and the yield can be improved.

The display panel and the electronic device of the embodiments of the present disclosure have been introduced in detail above. In this specification, specific examples are used to illustrate the principles and implementations of the present disclosure. The descriptions of the above embodiments are only used to help understand the technical solutions and core ideas of the present disclosure. A person of ordinary skill in the art should understand that the technical solutions described in the foregoing embodiments can be modified, or some of the technical features can be equivalently replaced. However, these modifications or replacements do not cause the essence of the corresponding technical solutions to deviate from the scope of the technical solutions of the embodiments of the present disclosure.

In summary, although the present disclosure has been disclosed as above in preferred embodiments, the above-mentioned preferred embodiments are not intended to limit the present invention. Those of ordinary skill in the art can make various changes and modifications without departing from the spirit and scope of the present disclosure. Therefore, the protection scope of the present disclosure is subject to the scope defined by the claims.

What is claimed is:

1. A display panel, comprising:
a first panel comprising a first driving circuit layer, a pixel definition layer disposed on the first driving circuit layer, and a plurality of light-emitting units, wherein the first panel further comprises a plurality of light-transmitting regions, one of the light-transmitting regions is disposed between two adjacent light-emitting units;
a second panel comprising a plurality of photoelectric sensing elements and a second driving circuit layer, wherein the second driving circuit layer comprises a plurality of second driving transistors, the second driving transistors are electrically connected to the photoelectric sensing elements, and the photoelectric sensing elements are opposite to the light-transmitting regions; and
a binding layer disposed between the first panel and the second panel, and configure to bind the first panel and the second panel,
wherein the pixel definition layer comprises a light-transmitting portion and an opaque portion, the opaque portion of the pixel definition layer comprises a plurality of pixel openings, one of the light-emitting units is arranged in one of the pixel openings, the light-transmitting portion of the pixel definition layer is disposed in the light-transmitting regions, the light-transmitting portion of the pixel definition layer comprises a plurality of light-transmitting holes, and each of the light-transmitting holes is disposed between two adjacent pixel openings.

2. The display panel according to claim 1, wherein the binding layer is light-transmissive.

3. The display panel according to claim 2, wherein the binding layer is an optical adhesive.

4. The display panel according to claim 2, wherein a thickness of the binding layer ranges from 52 μm to 100 μm.

5. The display panel according to claim 1, wherein the pixel definition layer is black.

6. The display panel according to claim 1, wherein an orthographic projection of each of the light-transmitting holes on the second driving circuit layer at least partially overlaps an orthographic projection of a corresponding photoelectric sensing element on the second driving circuit layer.

7. The display panel according to claim 1, wherein a diameter of the light-transmitting hole is d, a distance from an end of the light-transmitting hole of the first panel far from the second panel to the photoelectric sensing element is H, an incident angle of the display panel is θ, θ=arctan (d/2H), a value of H ranges from 90 μm to 150 μm, and a value of d ranges from 25 μm to 60 μm.

8. The display panel according to claim 1, wherein the first panel further comprises a first substrate, the first driving circuit layer is formed on the first substrate, the light-emitting units are formed on a side of the first driving circuit layer away from the first substrate, and the binding layer is disposed on a side of the first substrate away from the first driving circuit layer.

9. The display panel according to claim 1, wherein the first panel further comprises a first encapsulation layer and a plurality of lenses, the first encapsulation layer is formed on the pixel definition layer and covers the light-emitting units, the plurality of lenses are formed on the first encapsulation layer and arranged in an array, and one of the lenses is opposite to one of the light-transmitting regions.

10. The display panel according to claim 1, wherein the second panel further comprises a second encapsulation layer, the second encapsulation layer is formed on the second driving circuit layer and covers the photoelectric sensing elements, and the binding layer is disposed on a side of the second encapsulation layer away from the second driving circuit layer.

11. The display panel according to claim 1, wherein the first driving circuit layer comprises a plurality of first driving transistors correspondingly electrically connected to the light-emitting units, the second driving circuit layer further includes a plurality of third driving transistors, and the third driving transistors are electrically connected to the first driving transistors.

12. The display panel according to claim 11, further comprising a plurality of via holes formed on the binding layer, wherein each of the via holes is filled with a conductive material, one of the first driving transistors and one corresponding third driving transistor are electrically connected through one of the via holes.

13. The display panel according to claim 1, wherein the photoelectric sensing elements are photoelectric detecting elements.

14. The display panel according to claim 1, wherein the first panel comprises a first substrate, and the first driving circuit layer is disposed between the first substrate and the pixel definition layer; the second panel comprises a second substrate, the plurality of photoelectric sensing elements are disposed on one side of the second substrate, and the second driving circuit layer is disposed between the second substrate and the plurality of photoelectric sensing elements; and the binding layer is sandwiched between the first substrate and the second substrate.

15. An electronic device, comprising a device main body, wherein the electronic device further comprises a display panel, the display panel is disposed on the device main body or in the device main body, and the display panel comprises:

a first panel comprising a first driving circuit layer, a pixel definition layer disposed on the first driving circuit layer, and a plurality of light-emitting units, wherein the first panel further comprises a plurality of light-transmitting regions, one of the light-transmitting regions is disposed between two adjacent light-emitting units;

a second panel comprising a plurality of photoelectric sensing elements and a second driving circuit layer, wherein the second driving circuit layer comprises a plurality of second driving transistors, the second driving transistors are electrically connected to the photoelectric sensing elements, and the photoelectric sensing elements are opposite to the light-transmitting regions; and a binding layer disposed between the first panel and the second panel, and configure to bind the first panel and the second panel, wherein the pixel definition layer comprises a light-transmitting portion and an opaque portion, the opaque portion of the pixel definition layer comprises a plurality of pixel openings, one of the light-emitting units is arranged in one of the pixel openings, the light-transmitting portion of the pixel definition layer is disposed in the light-transmitting regions, the light-transmitting portion of the pixel definition layer comprises a plurality of light-transmitting holes, and each of the light-transmitting holes is disposed between two adjacent pixel openings.

16. The electronic device according to claim 15, wherein the binding layer is light-transmissive, and a thickness of the binding layer ranges from 52 μm to 100 ∪m.

17. The electronic device according to claim 15, wherein the first panel further comprises a first encapsulation layer and a plurality of lenses, the first encapsulation layer is formed on the pixel definition layer and covers the light-emitting units, the plurality of lenses are formed on the first encapsulation layer and arranged in an array, and one of the lenses is opposite to one of the light-transmitting regions.

18. The electronic device according to claim 15, wherein the first driving circuit layer comprises a plurality of first driving transistors correspondingly electrically connected to the light-emitting units, the second driving circuit layer further includes a plurality of third driving transistors, and the third driving transistors are electrically connected to the first driving transistors.

19. The electronic device according to claim 15, wherein the pixel definition layer is black.

20. A display panel, comprising:

a first panel comprising a plurality of light-emitting units, wherein the first panel further comprises a plurality of light-transmitting regions, one of the light-transmitting regions is disposed between two adjacent light-emitting units;

a second panel comprising a plurality of photoelectric sensing elements and a second driving circuit layer, wherein the second driving circuit layer comprises a plurality of second driving transistors, the second driving transistors are electrically connected to the photoelectric sensing elements, and the photoelectric sensing elements are opposite to the light-transmitting regions; and a binding layer disposed between the first panel and the second panel, and configure to bind the first panel and the second panel, wherein the binding layer is light-transmissive, and a thickness of the binding layer ranges from 52 μm to 100 μm.

* * * * *